(12) United States Patent
Watanabe et al.

(10) Patent No.: US 8,035,202 B2
(45) Date of Patent: Oct. 11, 2011

(54) ELECTRONIC DEVICE HAVING A WIRING SUBSTRATE

(75) Inventors: Shinji Watanabe, Tokyo (JP); Yukio Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 72 days.

(21) Appl. No.: 12/498,109

(22) Filed: Jul. 6, 2009

(65) Prior Publication Data

US 2009/0321965 A1      Dec. 31, 2009

Related U.S. Application Data

(62) Division of application No. 10/574,898, filed as application No. PCT/JP2004/014739 on Oct. 6, 2004, now abandoned.

(30) Foreign Application Priority Data

Oct. 6, 2003   (JP) .................................. 2003-346580

(51) Int. Cl.
*H01L 23/58* (2006.01)
(52) U.S. Cl. ........ 257/635; 257/642; 257/676; 257/747; 257/E25.031
(58) Field of Classification Search .................. 257/635, 257/642, 676, 747
See application file for complete search history.

(56) References Cited

U.S. PATENT DOCUMENTS

| | | | |
|---|---|---|---|
| 6,791,199 B2 | 9/2004 | Sakamoto et al. | |
| 2001/0053598 A1 | 12/2001 | Koyama | |
| 2002/0135057 A1 | 9/2002 | Kurita | |
| 2003/0101584 A1 | 6/2003 | Matsumura | |
| 2003/0116347 A1* | 6/2003 | Kubo et al. | 174/260 |
| 2004/0155322 A1* | 8/2004 | Cho et al. | 257/676 |
| 2006/0234420 A1* | 10/2006 | Yokozuka et al. | 438/106 |

FOREIGN PATENT DOCUMENTS

| | | |
|---|---|---|
| CN | 1235699 | 11/1999 |
| JP | 2-165073 | 6/1990 |
| JP | 4-82241 | 3/1992 |
| JP | 11-251368 | 9/1999 |
| JP | 2000-151057 | 5/2000 |
| JP | 2000-156386 | 6/2000 |
| JP | 2000-223602 | 8/2000 |
| JP | 2000-299427 | 10/2000 |

(Continued)

OTHER PUBLICATIONS

Japanese Patent Office issued a Japanese Office Action dated Apr. 8, 2009, Application No. 2005-514495.

*Primary Examiner* — Wai Sing Louie
(74) *Attorney, Agent, or Firm* — Young & Thompson

(57) ABSTRACT

A semiconductor chip of the present invention has a wiring substrate and a chip part. The wiring substrate has an insulating resin layer having a first major surface and a second major surface, and a first wiring layer disposed on the insulating resin layer on the second major surface side. The chip part has a projection electrode on the bottom surface. The insulating resin layer holds the chip part such that the bottom and side surfaces of the chip part are in contact with the insulating resin layer, and the top surface of the chip part is exposed on the insulating layer on the first major surface side. The projection electrode of the chip part is connected with the first wiring layer.

11 Claims, 10 Drawing Sheets

FOREIGN PATENT DOCUMENTS

| | | |
|---|---|---|
| JP | 2000286297 | 10/2000 |
| JP | 2000-315705 | 11/2000 |
| JP | 2001-7156 | 1/2001 |
| JP | 2002-368155 | 12/2002 |
| JP | 2003-8167 | 1/2003 |
| JP | 2004-311788 | 11/2004 |
| WO | WO 98/20542 | 5/1998 |

* cited by examiner

ELECTRONIC DEVICE HAVING A WIRING SUBSTRATE

TECHNICAL FIELD

The present invention relates to an electronic device and its manufacturing method, and in particular relates to a structure in which a semiconductor chip is mounted on a wiring substrate by the flip chip method and its method of mounting.

BACKGROUND ART

Conventionally, in the connection structure of a semiconductor chip and a wiring substrate by the flip chip method, the reliability of the connection portion becomes one of the important problems.

As means for increasing the reliability, usually sealing resin is injected between the semiconductor chip and the wiring substrate to alleviate stress on the connection portion. The underfill method was used, as the resin injection method, in most cases, in which the semiconductor chip is mounted on the wiring substrate by the flip chip method and then liquid resin is poured and hardened (for example, Japanese Patent Laid-Open No. 2000-156386: first conventional example).

Explanations are given of the flip chip mounting method in which underfill resin is later injected according to the first conventional example, with reference to FIGS. 1A to 1C. As shown in FIG. 1A, a wiring substrate includes wiring pattern 2 formed on insulating layer 12 and solder resist 3 to cover wiring pattern 2. Generally, insulating layer 12 and wiring pattern 2 are multi-layered.

In the step of mounting the semiconductor chip, as shown in FIG. 1B, bump 5 is formed on a pad (electrode) arranged on the circuit surface of semiconductor chip 4, and the exposure portion of wiring pattern 2 on the wiring substrate and bump 5 for semiconductor chip 4 are aligned and are joined.

In the subsequent step shown in FIG. 1C, the liquid resin is injected into a space between semiconductor chip 4 and the wiring substrate and is hardened to form underfill 17 that seals semiconductor chip 4, and then a semiconductor package of the flip chip mounted structure is completed.

However, in the first conventional example in which the underfill resin is injected later, as the connection means, various techniques, such as metal diffusion junction, metal fusion junction, junction by metal content resin paste, are used. In any technique, heat is applied to the semiconductor chip and the wiring substrate during mounting. Therefore, in particular, in cases where an organic substrate is used as the wiring substrate, stress is caused by the difference between thermal expansion coefficients of the semiconductor chip and the wiring substrate and the stress is concentrated on the connection portion when the temperature lowers after the semiconductor chip has been mounted. Therefore, there are problems in that the connection portion is apt to be broken and improvement of reliability is difficult.

As another manufacturing method, a technique is proposed, in which resin is previously applied on a wiring substrate, and, during mounting of a semiconductor chip, the resin between the semiconductor chip and the wiring substrate is hardened simultaneously with the junction while bumps formed on the semiconductor chip are maintained in contact with pads formed on the wiring substrate by the application of pressure to the chip (for example, Japanese Patent Laid-Open No. 4-82241: second conventional example).

The manufacturing method in the technique according to the second conventional example is explained with reference to FIGS. 2A and 2B. First, as shown in FIG. 2A, liquid resin 17a is supplied to a position on which the semiconductor chip is mounted on the wiring substrate. Generally, an air-type dispensing device is used to supply the resin.

Then, semiconductor chip 4 on which bumps 5 are formed is adsorbed and held by chip mounting tool 18 that has adsorption hole 19, and semiconductor chip 4 is aligned with wiring on the wiring substrate. Successively, as shown in FIG. 2B, chip mounting tool 18 is moved down to make bumps 5 come into contact with wiring pattern 2 while semiconductor chip 4 is adsorbed and held. While this state is maintained, heat and pressure are applied to semiconductor chip 4 to connect the bumps and the wiring and to harden the resin between the semiconductor chip and the wiring substrate, thereby forming underfill 17. In the second conventional example, although expansion of the substrate by heat during mounting has not changed, stress, which is generated due to contraction of the substrate when it returns to room temperature, is dispersed over underfill 17. Therefore, it is possible to prevent to poor connection caused by the difference between thermal expansion coefficients of the semiconductor chip and the wiring substrate, that is, the problem in the above-described technique where the resin is injected and hardened after mounting. Further, this example is provided with the feature in which low-temperature connection is available only by contact of bumps 5 and the wiring on the wiring substrate. However, in recent years, demand for use in portable terminal devices has become severe, and it has become essential to manufacture discrete semiconductor chips that have thin profiles. A significant problem emerges in which resin climbs the chip mounting tool of the semiconductor chip mounting device while the chip is being mounted in the case of thin chips, and resin adheres to the tool.

As recent electronic devices become more sophisticated in performance and functionality, demand for higher frequencies and higher densities is steadily increasing. Particularly, in electronic device where analog circuits that generate enormous noises are incorporated, e.g., a mobile phone and a wireless LAN, and in motherboards for personal computers with higher clock speeds, noises that are transmitted to wires in the wiring substrate may cause malfunction depending on the levels of the noise. Therefore, how the noise is reduced or blocked is an important problem.

In order to reduce the effects caused by noise, a technique is used, in which power source and ground patterns are arranged in the wiring layer of a core layer and filled-in patterns that connect with the ground are arranged as much as possible in an outmost wiring layer. The example for mounting a semiconductor chip according to this conventional technique will be explained, with reference to FIGS. 3A and 3B. FIG. 3A is a plan view of the uppermost wiring layer, and FIG. 3B is a cross-sectional view of the area around the mounting portion of semiconductor chips. Bumps for semiconductor chip 4 are connected to pads 20 formed on the uppermost wiring layer and are connected with via hole lands 21 through wiring pattern 2. Also, in the uppermost wiring layer, ground patterns 2a for reducing the above-mentioned effects caused by the noise are formed in filled-in patterns. In the internal layer of the wiring substrate, writing patterns 2 that transmit signals from semiconductor chip 4 connected to pads 20 are formed, and are connected to terminals of other electronic parts through these wiring patterns in the wiring substrate. In this example, writing patterns 2 that are connected to the other electronic parts pass through the lower layer of ground pattern 2a arranged in the uppermost layer, thereby reducing the above-mentioned effects caused by the noise.

Interlayer connection for the wiring patterns in the wiring substrate having a plurality of wiring layers is performed through via hole 22. Each wiring pattern passes through the internal wiring layer by via hole 22 and is drawn to the surface layer through via hole 22 once again to be connected with the corresponding terminal of the other parts.

Also, FIGS. 4A and 4B show an example in which semiconductor chips are laminated and BGA (ball grid array) is manufactured according to the conventional mounting method. FIG. 4A is a plan view of the wiring layer of an uppermost layer, and FIG. 4B is a cross-sectional view of a conventional BGA. Similarly, to the example shown in FIGS. 3A and 3B, bumps for semiconductor chip 4 are drawn out to via hole land 21 through pad 20 and through wiring patterns 2 formed in the uppermost wiring layer, and fall to the lower wiring layer. Pads 23 for wire bonding are formed on the peripheral portion of insulating layer 12 of the uppermost layer. On semiconductor chip 4, another semiconductor chip 16 is mounted in a face-up state. Electrodes (not shown) of another semiconductor chip 16 and pads 23 are connected with bonding wires 24.

In the manufacturing method according to the first conventional example shown in FIGS. 1A to 1C, in particular, when organic materials are used as insulating layers for the wiring substrate, the thermal expansion coefficient of the semiconductor chip is approximately 2 to 3 ppm/° C. while that of the organic wiring substrate is approximately 10 to 50 ppm/° C., and a large difference exists. After the application of heat during mounting, the wiring substrate contacts more than five times that of the chip, and thus much stress concentration is produced in the junction portion. This stress concentration causes problems of various junction breakages, i.e., breakage between bumps formed on electrodes on the chip and electrodes, breakage of electrodes, connection interface breakage between bumps and pads on the wiring substrate, and the stress concentration also caused a problem in which reliability is lowered. Further, since these failures are caused by the difference between the thermal expansion coefficients, the rate of failure occurrence tends to increase in large chips; in particular, it is very difficult to apply this example to a large chip having a peripheral structure in which bumps are arranged only in the periphery of the chip.

Next, the problems in the manufacturing method according to the second conventional example shown in FIGS. 2A and 2B will be explained. In this method, expansion of the substrate by heat during mounting has not changes. However, during mounting the semiconductor chip, stress caused by contraction of the substrate when it returns to room temperature is spread by the resin because the resin is hardened while the chip is being held by the chip mounting tool. Therefore, the connection failure caused by the difference between the thermal explosion coefficients of the semiconductor chip and the wiring substrate, i.e., the problem in the above-mentioned method in which the resin is injected after mounting, can be prevented. However, in recent years, demand for semiconductor devices having thin profiles for use in portable terminal devices has become severe, and it has become essential to manufacture discrete semiconductor chips that have thin profiles. As chips are thinner, the problem becomes obvious, that resin climbs the chip mounting tool of the semiconductor chip mounting device during mounting and adheres to the tool. This causes a problem that, while the resin previously applied on the substrate is pushed out during the steps of applying pressure and heat to the semiconductor chip and leaks out to the periphery of the chip, the resin climbs from the side surfaces of the chip and is in contact with the heated tool of the mounting device that adsorbs the chip and applies pressure to the chip, so that the resin becomes hardened, and then mounting after the next time becomes impossible.

The reason why this problem occurs is explained with reference to FIG. 5, which is a schematic view of a state in that a thin chip is adsorbed by the chip mounting tool. Chip mounting tool 18 is designed to be sufficiently smaller than semiconductor chip 4 taking into consideration cases where the resin climbs the top surface of semiconductor chip 4 by variations in the amount of discharge. However, in cases in which the thickness of semiconductor chip 4 is sufficiently thin, as shown in FIG. 18, and the chip mounting tool is smaller than the formation portion of bumps 5, there occurs a problem that the chip is broken when pressure is applied to semiconductor chip 4 by chip mounting tool 18. Therefore, for thin chips, chip mounting tool 18 must be made large so as to cover at least bumps 5, and the possibility is significantly increased, that resin that climbs up the top surface of the chip adheres to the chip mounting tool and becomes hardened.

Further, because the chip is thin, it is easy for the resin to climb, and therefore variations in the amount of resin that is discharged must be reduced to a fixed limit. It is generally known that when the thickness of the chip is 15 mm or less, controlling the amount of resin is difficult, in case of liquid resin, and reducing variations in the amount of resin that is discharged becomes difficult.

In terms of preventing the resin from adhering to the chip mounting tool and of controlling the proper amount of resin, film-shaped resin is proposed, and various resin materials, such as thermosetting, thermoplastic, and thermosetting and thermoplastic mixture resin materials, are being studied. However, film-shaped resin materials used for underfill are burdened with many problems peculiar to film shapes, for example, adhesive suitability when film-shaped resin adheres to the wiring substrate, the generation of bubbles, and connection reliability after hardening. These film-shaped resins have problems in that not only are they still under development, but material costs are also very expensive. Further other problems that occur when film-shaped resin materials are used is that conventional resin dispensing devices cannot be used and that capital investment must be made for new film adhering device, and this means there is the difficulty in reducing the manufacturing costs.

Next, structural problems are explained about electronic devices manufactured according to the conventional mounting method. In the conventional chip mounted structure in which parts for substrate surface layer wires are mounted, as shown in FIGS. 3A, 3B, 4A and 4B, many signal lines must fall in the wiring layer of the internal layer, and surface layer wires and internal layer wires are connected through via holes for interlayer connection. Therefore, though a general semiconductor chip with several hundreds of pins is mounted, an enormous number of via holes is required. Particularly, as the conventional example shown in FIGS. 3A and 3B, when the ground patterns are formed in the uppermost layer of the substrate in order to address higher frequencies, this becomes more significant, and almost all of the signal lines must fall in the internal layer.

Here, a via hole land diameter in the order of 200 μm is required in the leading-edge. As the number of via holes is increased, the area occupied by the via holes is increased. Therefore, it is very difficult to route wires because the wiring area is limited and alternative wiring is needed, the number of wiring layers must be increased in some cases, and the wiring length is further increased. Accordingly, to be able to use higher frequencies, it is necessary to minimize the number of via holes.

Further, since the increase in the number of via holes causes an increase in the rate of occupation in the via hole arrangement area and the wiring area in the uppermost layer, this causes many constraints on mounting intervals between parts and has harmful effects on the higher-density mounting of parts. For example, in BGA shown in FIGS. 4A and 4B, since bonding pads are arranged away from semiconductor chip 16, the bonding wires become longer and packaging in a chip size becomes difficult.

Also, concerning costs, via holes are formed one by one in the insulating layer by laser or the like in many cases, because the number of processes is increased in proportion to the increase in the number of via holes, as a matter of course, and therefore production costs for substrates increase. The increase in the number of layers significantly causes an increase in costs.

On the other hand, in terms of reliability, via holes are portions that are apt to be broken in the substrate. In terms of quality such as production variability, it is more preferable to have a smaller number of via holes. An increase in via holes becomes weakens to reliability.

DISCLOSURE OF INVENTION

The present invention has as its objects, firstly, to prevent breakage of the connection portion caused by the difference between the thermal expansion coefficients of the semiconductor chip and the wiring substrate after mounting, secondly, to prevent the resin from adhering to the chip mounting tool which is caused when sealing resin climbs up, thirdly, to make the supply of resin material in the mounting step necessary, fourthly, to reduce the number of via holes to the minimum, fifthly, to make the transmission line shortest length in order to address higher frequencies, sixthly, to improve the reliability of devices, seventhly, to enable electronic devices to be manufactured at low costs, and eighthly to make electronic devices thinner and smaller.

To attain the above-mentioned objects, an electronic device according to the present invention, includes a wiring substrate including an insulating resin layer having a first major surface and a second major surface and a first wiring layer disposed on the insulating resin layer on the second major surface side, and a chip part including a projection electrode on a bottom surface and being mounted on the wiring substrate. The insulating resin layer holds the chip part that in such a way a bottom and at least a part of side surfaces of the chip part are in contact with the insulating resin layer, and a top surface of the chip part is exposed on the insulating resin layer on the first major surface side, and the projection electrode of the chip part is connected with the first wiring layer In other words, the present invention provides the electronic device including a chip part that is mounted on the wiring substrate, this chip part having a projection electrode, and the wiring substrate includes an insulating resin layer having a first major surface and a second major surface and a first wiring layer disposed on said insulating resin layer on the second major surface side, and is characterized in that the chip part enters the insulating resin layer from the first major surface side and the projection electrode of the chip part penetrates the insulating resin layer and is connected to the first wiring layer.

To attain the above-mentioned objects, the present invention provides the method of manufacturing an electronic device, includes the steps of preparing an insulating resin layer having a first major surface and a second major surface, a wiring substrate having a first wiring layer disposed on said insulating resin layer on the second major surface side, and a chip part including a projection electrode, pushing the chip part into the insulating resin layer from the first major surface, and passing the projection electrode of the chip part through the insulating resin layer to be connected with the first wiring layer and sealing at least the surface of the chip part on which the projection electrode is formed with the resin of the insulating resin layer.

According to the present invention, in the method of mounting the chip on the wiring substrate by the flip chip method, bumps serving as projection electrodes formed on the terminals of the semiconductor chip are passed through the insulating resin layer of the wiring substrate, and the connection pads formed for the wiring layer of the internal layer and the projection electrodes are connected, thereby attaining the effect of preventing connection portion breakages caused by the difference between the thermal expansion coefficients of the semiconductor chip and the wiring substrate after mounting, that is, preventing the problem in the method where the resin is injected and hardened later, and thereby attaining the effect of preventing the resin from adhering to the chip mounting tool, caused when the resin climbs up, that is, preventing the problem in which the liquid resin is applied as the underfill materials supplied before the semiconductor chip is mounted.

Further, since the resin materials used to seal the semiconductor chip are made of the materials of the wiring substrate, it is unnecessary to supply resin materials in the mounting step. Therefore, the cost of resin materials, process costs, such as resin supply and cure, and capital investment associated with these are unnecessary, and mounting costs can be significantly reduced.

Also, in this chip mounted structure, the semiconductor chip can be buried in the wiring substrate, and it is possible to carry out thin and small semiconductor packages and electronic part substrates that enable three-dimensional high density chip mounted structures, in which other parts are mounted on the buried chip.

Further, by adopting the chip mounted structure in which electrodes of the electronic parts are connected to the internal layer patterns, the number of via holes can be reduced significantly. Therefore, according to the present invention, the following advantages can be obtained:

(1) the wiring area can be ensured, and wires can be routed easily taking into consideration their characteristics;

(2) the transmission line length and the flying wire length can be minimized;

(3) the cost of manufacturing substrates can be reduced by reducing the number of via holes, and the substrates can be made thinner and cheaper by reducing the number of layers in the wiring layer;

(4) size reduction (substrate having reduced size and a thin profile and higher density for mounting parts) can be carried out; and (5) reliability can be improved.

BEST MODE FOR CARRYING OUT THE INVENTION

Figure 1A:
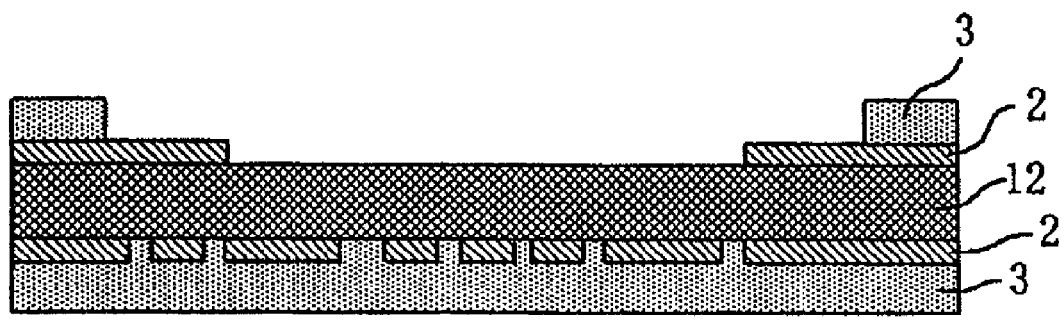
FIG. 1A is a cross-sectional view of a wiring substrate, in order to explain the mounting method according to the first conventional example.
Figure 1B:
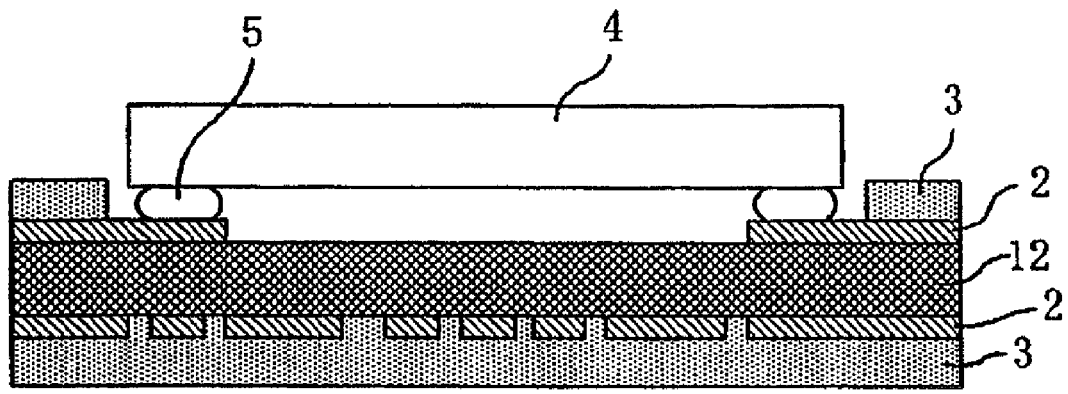
FIG. 1B is a cross-sectional view of a state in which a semiconductor chip is joined to the wiring substrate, in order to explain the mounting method according to the first conventional example.
Figure 1C:
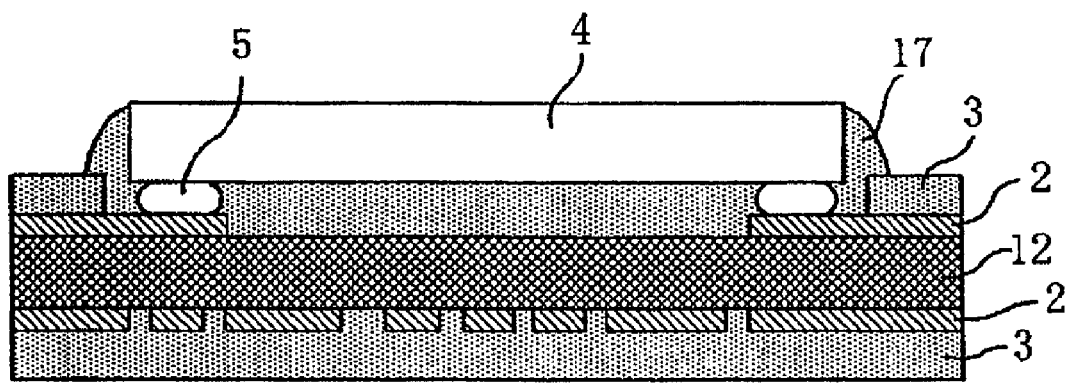
FIG. 1C is a cross-sectional view of a state in which underfill is formed between the semiconductor chip joined to the wiring substrate and the wiring substrate, in order to explain the mounting method according to the first conventional example.
Figure 2A:
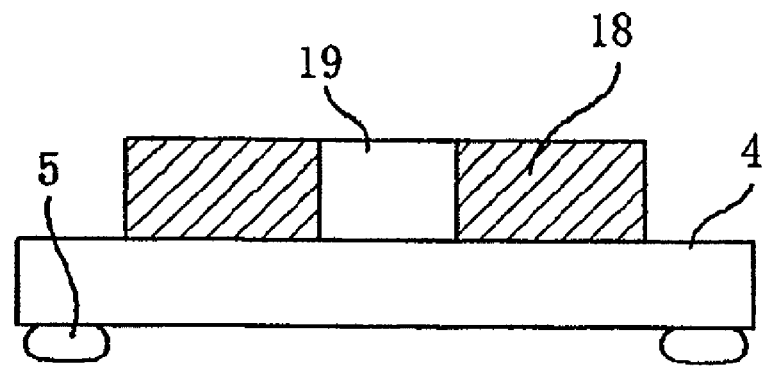
FIG. 2A A cross-sectional view of a state in which liquid resin is applied to the wiring substrate before the semiconductor chip is joined to the wiring substrate, in order to explain the mounting method according to the second conventional example.
Figure 2A:
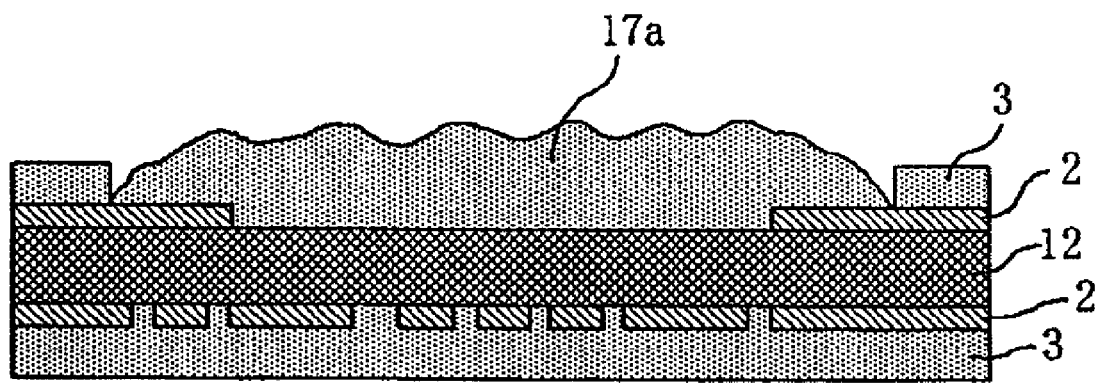
Figure 2B:
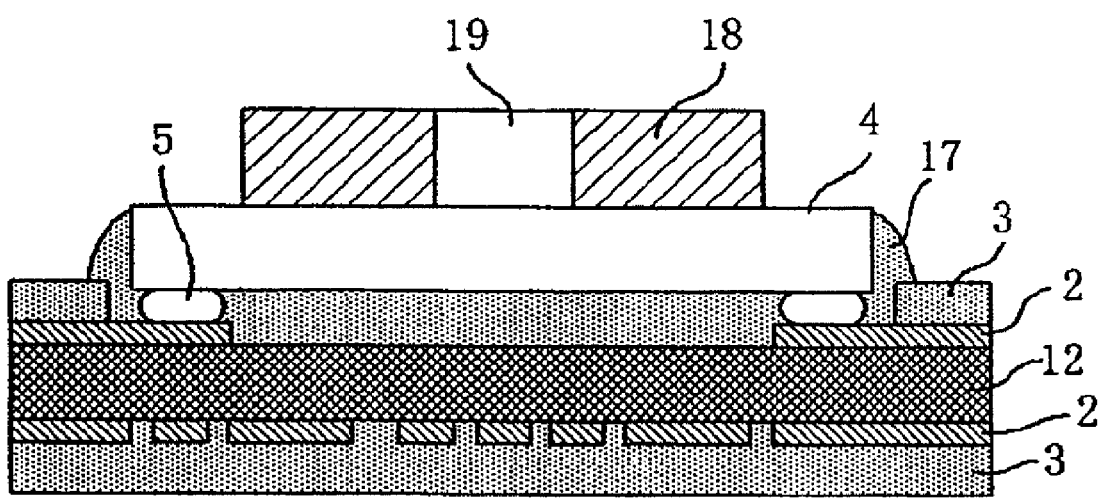
FIG. 2B A cross-sectional view of a state in which the semiconductor chip is joined to the wiring substrate, in order to explain the mounting method according to the second conventional example.
Figure 3A:
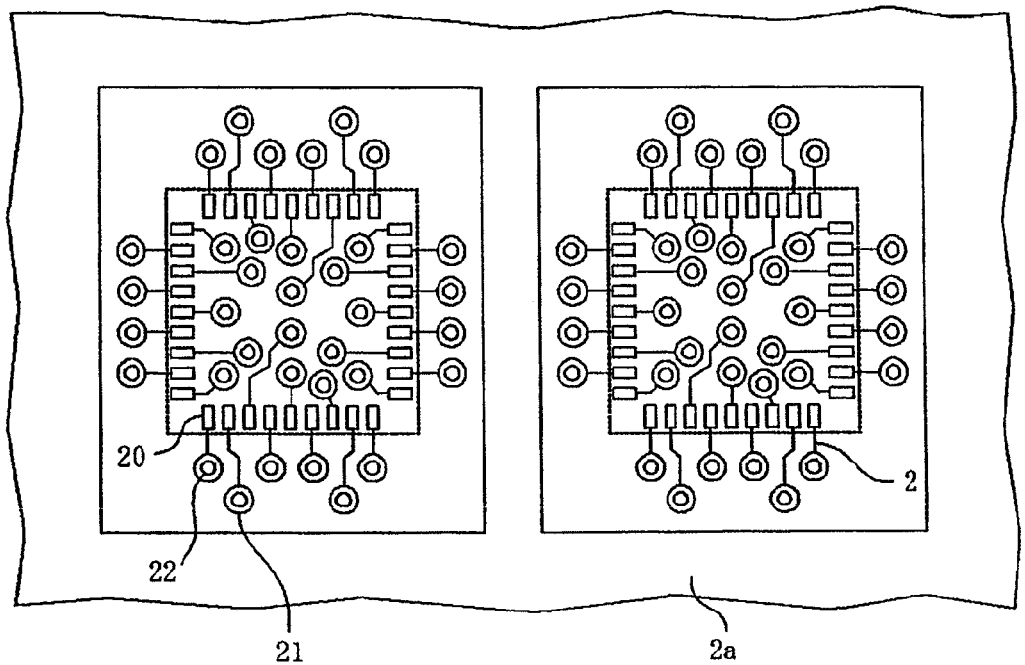
FIG. 3A A plan view of the uppermost wiring layer of a conventional wiring substrate having ground patterns on the uppermost layer.
Figure 3B:
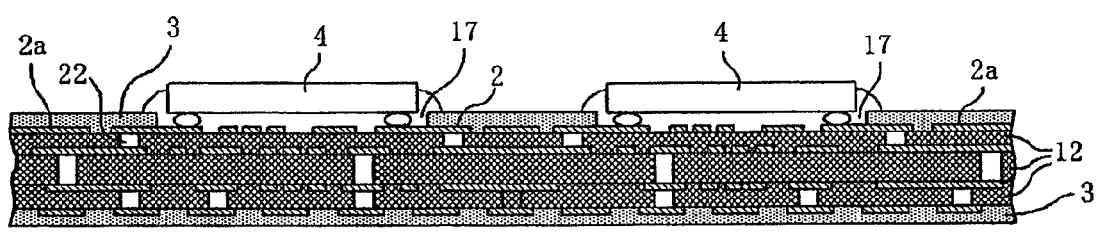
FIG. 3B A cross-sectional view of a state in which the semiconductor chip is mounted on the wiring substrate shown in FIG. 3A. plan view and a cross-sectional view showing a state in which a flip chip is mounted according to the conventional method.
Figure 4A:
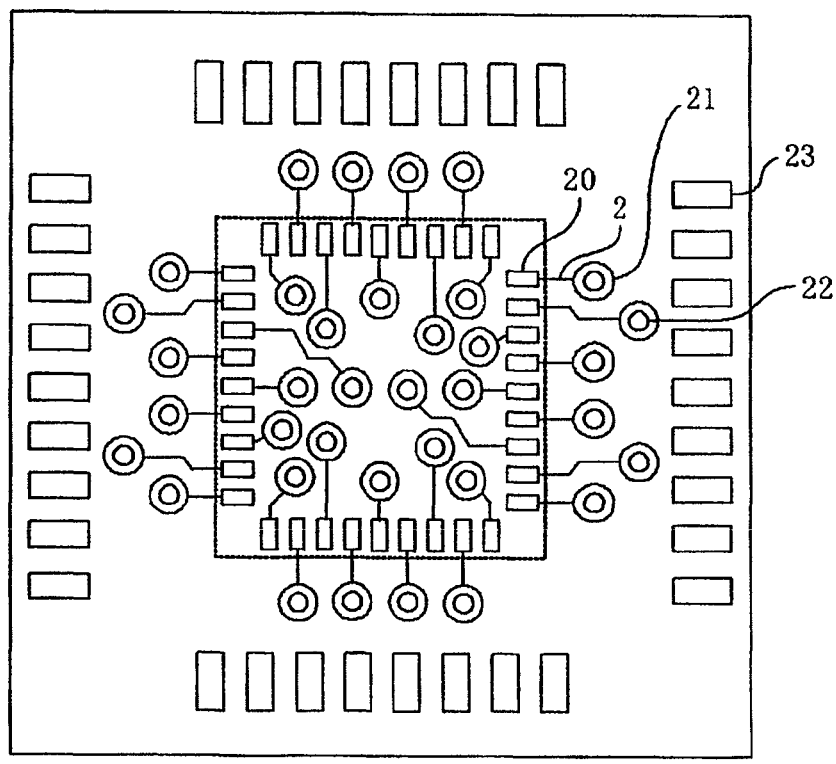
FIG. 4A A plan view of a wiring substrate used in the conventional BGA.
Figure 4B:
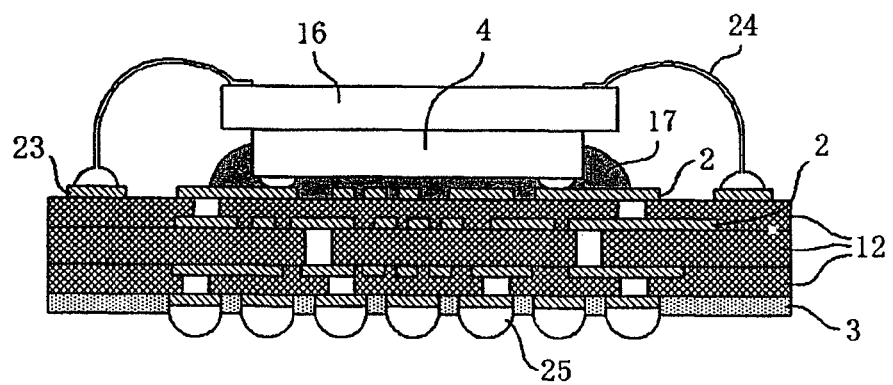
FIG. 4B A cross-sectional view of the conventional BGA using the wiring substrate shown in FIG. 4A.
Figure 5:
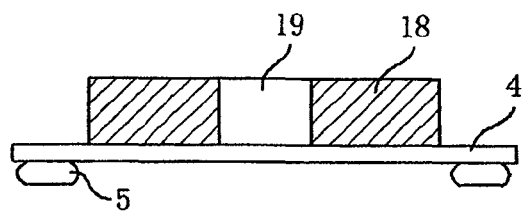
FIG. 5 A schematic view of a state in which a thin semiconductor chip is adsorbed and held by the chip mounting tool.
Figure 6A:
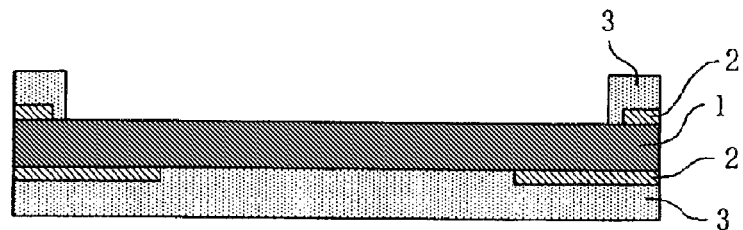
FIG. 6A A cross-sectional view of a wiring substrate according to a first embodiment of the present invention.
Figure 6B:
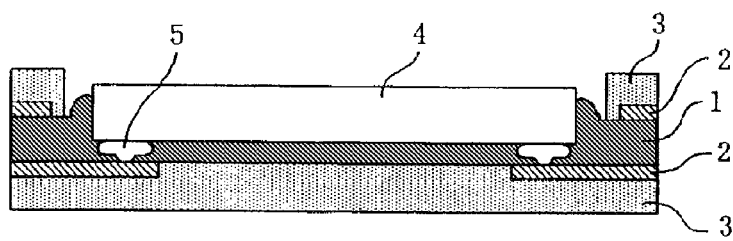
FIG. 6B A cross-sectional view of a state in which a semiconductor chip is mounted on the wiring substrate according to the first embodiment of the present invention.

FIGS. 6A and 6B are cross-sectional views showing the first embodiment of the present invention. FIG. 6A is a cross-sectional view of a wiring substrate with thermoplastic insulating resin layer 1 as a core layer through which bumps pass, i.e., one of features of the present invention. The wiring substrate is manufactured by using a copper-clad substrate, in which thin leaves of copper are formed on both surfaces of insulating resin layer 1, and is provided with wiring pattern 2 patterned by a subtractive process or the like and solder resists 3 coated on the outmost layer of both surfaces, namely, the wiring substrate is manufactured by the typical manufacturing method.

The copper-clad wiring substrate may be formed by the heat press lamination method or the method of planting after metal evaporation. Materials resistant to oxidizing, i.e., Au, are selected, as evaporation metal that is directly contacted or metal-joined to the bumps in order to conduct, thereby leading to an expected improvement in reliability.

Further, preferably, materials having thermal expansion coefficients close to that of the semiconductor chip are selected as insulating resin layer 1 in order to ensure reliability of the semiconductor chip and the bump connection portions. The thermal expansion coefficient is adjusted by adding filler, such as silica, or by using liquid crystal polymer that can be manufactured while the thermal expansion coefficient is freely controlled.

Figure 8A:
FIG. 8A A cross-sectional view of a semiconductor chip having bumps, which is mounted according to the present invention.
Figure 8B:
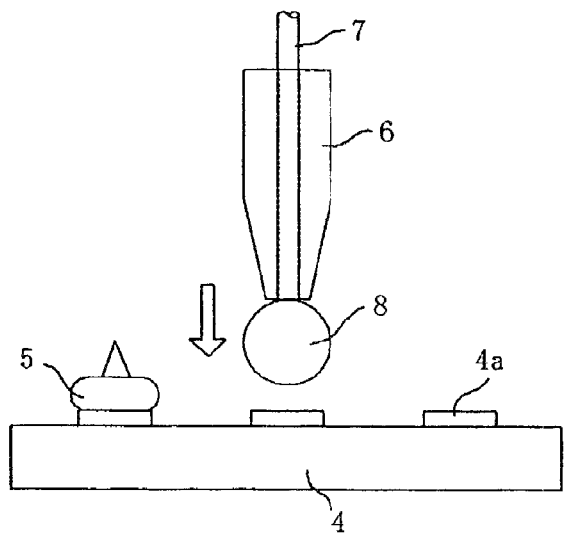
FIG. 8B A view showing one example of a method of forming bumps on the semiconductor chip.
Figure 8C:
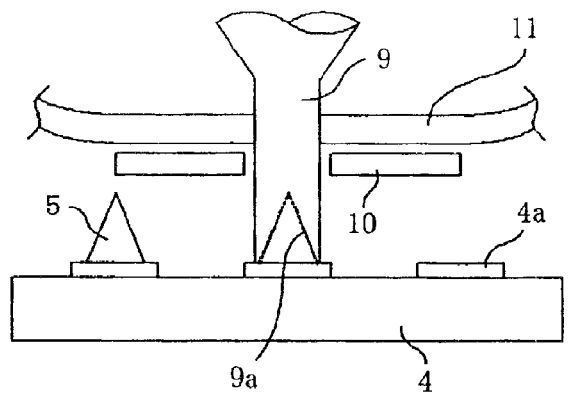
FIG. 8C A view showing another example of a method of forming bumps on the semiconductor chip.

FIG. 8A is a cross-sectional view of semiconductor chip 4, which is mounted on the substrate in the present invention. On the circuit surface of semiconductor chip 4, pads (not shown in FIG. 8A) connected to the internal circuit are formed, and bumps 5 having sharp tips are formed on the pads (electrodes). These bumps can be formed by the wire bonding method or by the stamping method, as shown in FIGS. 8B, 8C. Specifically, as shown in FIG. 8B, gold ball 8 is formed at the tip portion of gold wire 7 held by capillary 6, and then gold ball 8 is pushed to pad 4a formed on the circuit surface of semiconductor chip 4 so as to be joined and gold wire 7 is pulled to form bump 5. While the gold wire is projected from the capillary, a high voltage is applied between the torch and gold wire 7 to make a spark, thereby forming gold ball 8 into a ball shape by surface tension while the gold is molten and coagulated.

Alternatively, as shown in FIG. 8C, ribbon material 11 is stamped by punch 9 having conical concave portion 9a and die 10, and the stamped portion is joined to pad 4a formed on the circuit surface of semiconductor chip 4 to form bump 5. Incidentally, since thermoplastic insulating resin layer 1 is sufficiently softened by the application of heat during the mounting of semiconductor chip 4, tips of the bumps are not necessarily sharp, and there is no restriction on materials and high-temperature solder bumps, copper bumps, and gold bumps that may be used. However, when bumps have sharp tips, margins for the process condition are provided, for example, bumps can be passed through the insulating resin layer easily and the connection reliability can be ensured easily. Therefore, there are advantages in initial yields and reliability.

FIG. 6B is a cross-sectional view showing a state where the semiconductor chip shown in FIG. 8A is mounted on the wiring substrate shown in FIG. 6A. Semiconductor chip 4 provided with bumps 5 is mounted on thermoplastic insulating resin layer 1 which is the core material of the wiring substrate, such that bumps 5 pass through insulating resin layer 1 to connect with the lower layer wire and are buried in insulating resin layer 1.

Next, the mounting method of this mounted structure is explained. In order to improve adhesiveness between semiconductor chip 4 and insulating resin layer 1 of the wiring substrate, preferably, the surface of insulating resin layer 1 is previously activated by the plasma process or by ultraviolet ray irradiation.

Solder resist 3 is not applied to any portion on which semiconductor chip 4 is mounted on the wiring substrate and the portion is opened. A register mark provided on the wiring substrate and semiconductor chip 4 that is adsorbed and held by the chip mounting tool of the mounting device and which to be aligned are subjected to image processing. In this case, the register mark may be formed on the wiring layer of the upper layer, however, since it is difficult to form patterns positions in the upper layer and the lower layer accurately, the register mark is preferably formed on the wiring of the lower layer when the terminal pitches are fine. Also, when thermoplastic resin that is to be applied is not transparent, to make the mark visible from the upper side, insulating resin layer 1 is provided with through holes in the register mark portion by punching or the like before copper is coated, or the insulating resin in the register mark portion is opened by laser technique, the photo/etching technique, or the like after copper coating/pattern formation. The chip mounting tool of the mounting device can apply heat and pressure, and this tool applies pressure to the wiring substrate that is aligned while applying heat to semiconductor chip 4 that is adsorbed and keep at the temperature at which insulating resin layer 1 is sufficiently softened. In this case, in order to transfer heat that is applied to semiconductor chip 4 to the wiring substrate efficiently, preferably, heat is applied to the stage at which the wiring substrate is held. When heated semiconductor chip 4 is in contact with insulating resin layer 1, insulating resin layer 1 is softened, and therefore bumps 5 formed on the semiconductor chip pass through insulating resin layer 1 easily and bumps 5 and wiring patterns 2 are connected. In the step for connecting bumps 5 and wiring patterns 2, ultrasonic vibration may be applied to the semiconductor chip or the wiring substrate. Also, since the connection surface of the wiring connected with bumps 5 is already covered by insulating resin layer 1, the connection surface is prevented from undergoing oxidation and pollution during the manufacturing steps. The connection between bumps 5 and the lower layer wiring may be applied to both the metal diffusion bonding and the contact-holding method only by contact with insulating resin.

The tips of bumps are formed in sharp shapes, and the tips are deformed while pushing insulating resin layer 1 aside. Therefore, connection reliability is further improved. When semiconductor chip 4 is buried to a desirable depth and the junction between the bumps and wires is completed, the application of heat to the chip mounting tool is concluded. The application of pressure is maintained until the insulating resin layer is sufficiently hardened, and then the chip mounting tool is raised. The chip mounted structure in FIG. 6B can be carried out according to the above-mentioned materials and mounting method.

Further, this mounted structure and manufacturing method can be applied to a semiconductor chip that is secondarily wired on the circuit surface of the chip, packaged electronic devices, such as wafer level CSP, and passive electronic parts.

Figure 7A:
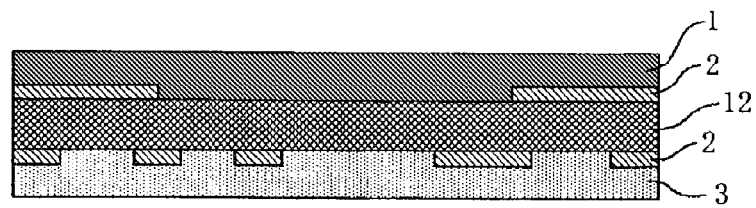
FIG. 7A A cross-sectional view of a wiring substrate according to a second embodiment of the present invention.
Figure 7B:
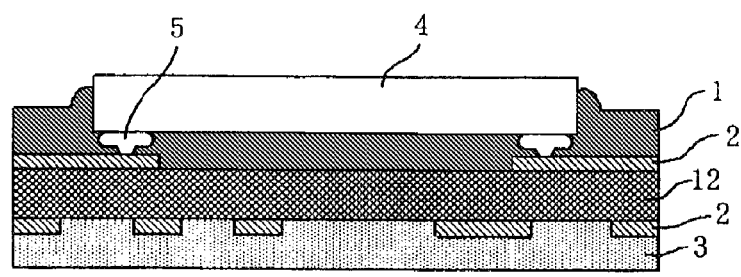
FIG. 7B A cross-sectional view of a state in which a semiconductor chip is mounted on the wiring substrate according to the second embodiment of the present invention.

FIGS. 7A and 7B are cross-sectional views showing the second embodiment. FIG. 7A shows wiring substrate in which wiring patterns 2 are formed on the front and back surfaces of insulating layer 12, i.e., the core layer, solder resist 3 is coated on the back surface, and insulating resin layer 1, that functions as the solder resist and is made of thermoplastic resin, is formed on the front surface. FIG. 7B is a cross-sectional view showing that the semiconductor chip is mounted on the wiring substrate in FIG. 7A according to the method explained in the first embodiment. According to this embodiment, insulating resin layer 1 can function as both the solder resist and the sealing resin.

As described above, the thermoplastic resin is used as the insulating resin layer, repair, which was difficult when the conventional underfill was applied, is enabled by the reapplication of heat. Also, the semiconductor chip may be mounted by pre-cured materials, such as epoxy resin, instead of thermoplastic resin, though repairs cannot be performed. As thermoplastic resins, resins such as liquid crystal polymer, acrylic, polyester, ABS, polycarbonate, phenoxy, polysulfone, polyetherimide, polyacrylate, norbornene bases may be used. As thermosetting resins, epoxy resins, such as bisphenol A type, dicyclopentadienyl type, cresol novolak type, biphenyl type, and naphthalene type, phenol resins, such as resol type, novolak type, may be applied. A mixture of resins including a plurality of these resins may be used.

For example, by using "IBF-3021" produced by SUMITOMO BAKELITE Co., Ltd., resin material including thermoplastic resin, as the main ingredient, and thermosetting resin as a trace additive, the preferable result can be obtained. Specifically, the device in FIG. 7B is manufactured using this resin material, in the cycle test (−40 to 125° C.), that is, and therefore the acceleration test, reliability is ensured at a level that can be applied to consumer devices.

Hereinafter, applications of the above-mentioned embodiments are explained.

(Application 1)

Figure 9:
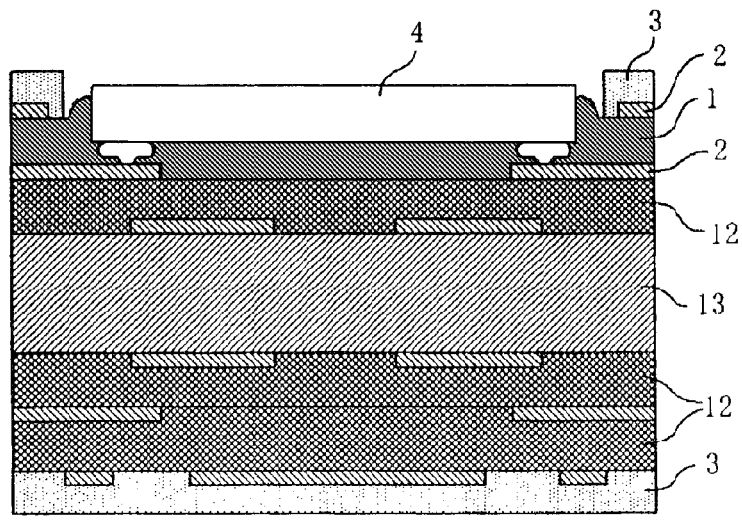
FIG. 9 A cross-sectional view of application 1 of the present invention.

FIG. 9 is a cross-sectional view showing an example in which the wiring substrate in FIG. 6A is applied to a substrate having a multi-layer wiring layer. In this example, wiring patterns 2 and insulating layers are laminated on both surfaces of core layer 13 to form a multi-layer wiring substrate. Thermoplastic insulating resin layer 1 is applied only to the layer on which semiconductor chip 4 is mounted. The thickness of insulating resin layer 1 is approximately 30 to 100 μm.

A typical substrate structure is envisaged except for insulating resin layer 1, i.e., a glass epoxy substrate is used as core layer 13 and built-up insulating resin is used as insulating layer 12, and thermosetting resins are used for each resin layer. Only insulating resin layer 1 is made of thermoplastic resin, and the other insulating resin layers are made of thermosetting resins. Softened deformations of insulating layers 12 and core layer 13, caused by the heat during the mounting of semiconductor chip 4 are very small, and the same mounting technique as FIG. 6B can be used. Therefore, this example can be readily applied to the multi-layer wiring substrate.

(Application 2)

Figure 10:
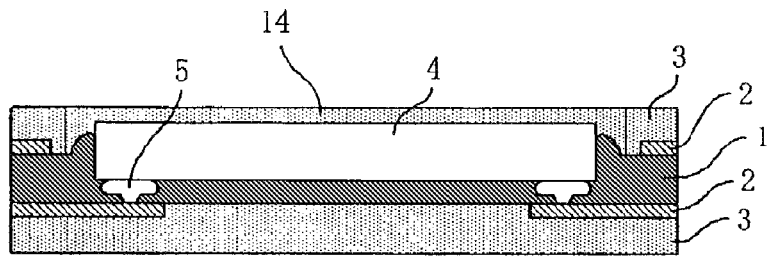
FIG. 10 A cross-sectional view of application 2 of the present invention.

FIG. 10 shows that coating resin 14 is formed in the embodiment in FIG. 6B by the dispensing or screen print method, and the top surface of the semiconductor chip is reinforced by resin to make the surface flat.

This structure has superiority in that, when external stress is given to this chip mounted structure, caused by drop impact, vibration, temperature cycle, or the like, the stress is prevented from concentrating on the end surfaces of semiconductor chip 4. Therefore, connection reliability can be improved and the range of uses can be increased.

(Application 3)

Figure 11:
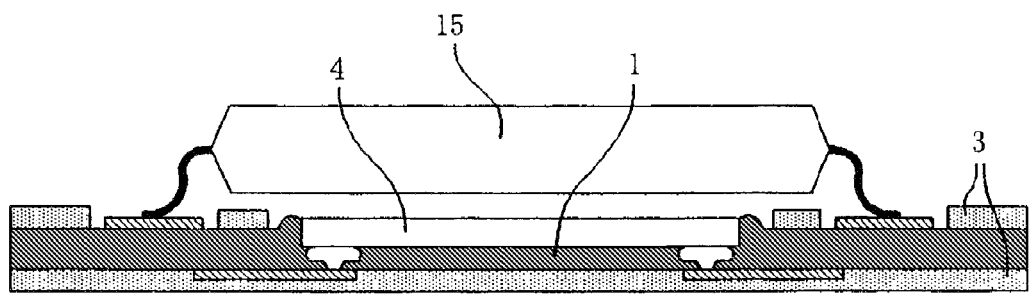
FIG. 11 A cross-sectional view of application 3 of the present invention.

FIG. 11 is a cross-sectional view showing an example in which packaged electronic part 15 is overlaid and mounted on semiconductor chip 4 buried in the wiring substrate. Cream solder is print-supplied to pad electrodes of the wiring substrate that is manufactured by the mounting is technique in FIG. 6B and includes the semiconductor chip therein, electronic part 15 is mounted and reflow soldered to form a surface mounting wiring substrate.

However, in this case, as insulating resin layer 1 that is made of thermoplastic resin, materials which have a high temperature point at which they start to soften, must be selected such that the connection portion of semiconductor chip 4 is not broken at the reflow temperature.

For example, liquid crystal polymer materials having relatively high heat resistance, i.e., a liquid crystal transition point of about 300° C., may be applied as materials for insulating resin layer 1.

(Application 4)

Figure 12:
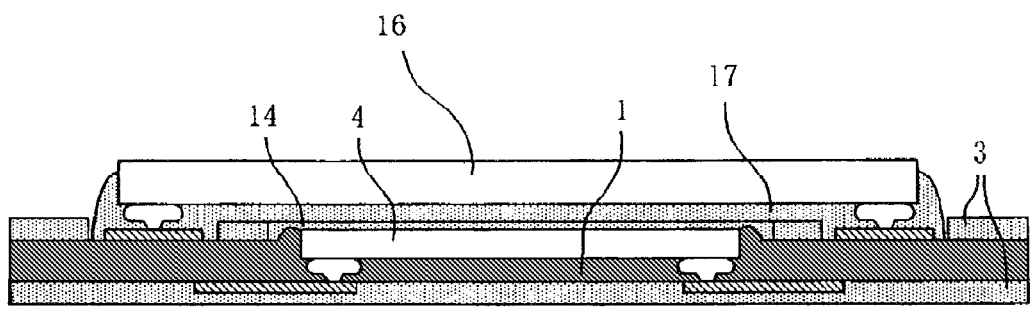
FIG. 12 A cross-sectional view of application 4 of the present invention.

FIG. 12 is a cross-sectional view showing an example in which another semiconductor chip 16 is overlaid and mounted on semiconductor chip 4 buried in the wiring substrate. Semiconductor chip 4 is mounted by the mounting technique in FIG. 6B. Semiconductor chip 16 is mounted by the pressure welding technique or the crimping technique of the flip chip, i.e., the conventional technique. However, in order to prevent breakages of the connection portions in semiconductor chip 4, caused by heat during the mounting of semiconductor chip 16, liquid crystal polymer materials or the like having a relatively high liquid crystal transition point are available as materials for insulating resin layer 1.

Further, in the step of mounting semiconductor chip 16, the projections and depressions at the lower portion of semiconductor chip 16 have an effect on the liquidity of the underfill and lead to occurrences of void. Therefore, preferably, the top surface of semiconductor chip 4 is flattened by coating resin 14, as in the example in FIG. 10. Also, when the flip chip mounting technique, that can mount chips at a relatively low temperature is used in conjunction with ultrasound as the mounting technique of semiconductor chip 16, the range of materials that can be selected for insulating resin layer 1 can be increased.

(Application 5)

Figure 13:
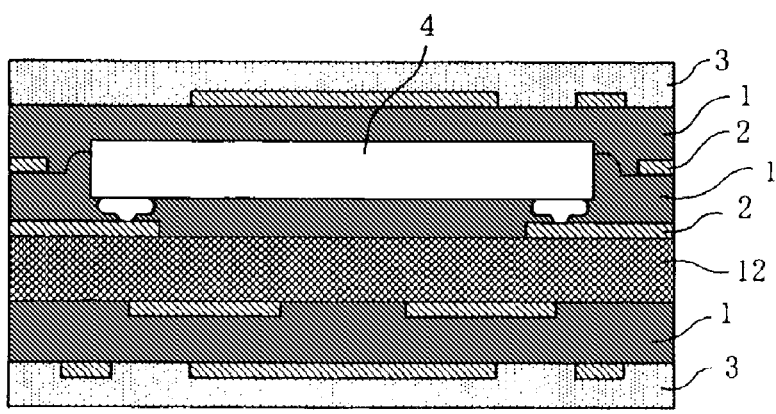
FIG. 13 A cross-sectional view of application 5 of the present invention.

FIG. 13 is a cross-sectional view showing an electronic device using a wiring substrate of a multi-layer structure formed by overlaying one or more insulating resin layers and wiring layers in one or both of the upper and lower layers of the chip mounted structure, while applying the chip mounted structure and its manufacturing method in FIG. 6B, and is characterized in that the semiconductor chip is arranged in the wiring substrate. In this example, thermoplastic resin or PREPREG (PRE-imPREGnated sheet material) may be used as insulating resin layer 1. The thickness of insulating resin layer 1 is approximately 30 to 100 μm.

According to the chip mounted structure shown in FIG. 6B, the structures can be reduced in costs, as described above. According to a comparison of mounting parts on a wiring substrate by the same technique as used in mounting a semiconductor chip on a typical substrate, not only can the cost of the final products be reduced, but the density of mounted parts can be increased by mounting the parts internally on the wiring substrate. Therefore, small and slim products can be made at low costs easily.

(Application 6)

Figure 14:
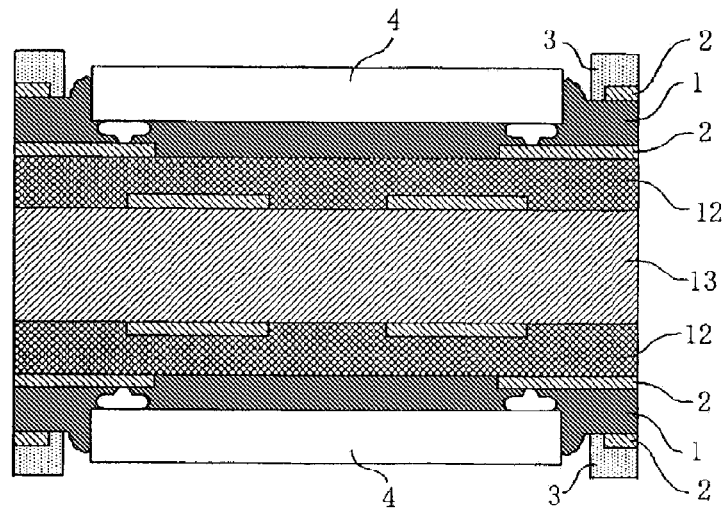
FIG. 14 A cross-sectional view of application 6 of the present invention.

FIG. 14 is a cross-sectional view showing an electronic device that is made by applying the chip mounted structure and its manufacturing method in FIG. 6B and uses a wiring substrate of a multi-layer structure in which the chip mounted structures are formed on both surfaces of the wiring substrate. In this example, wiring layers and insulating layers 12 are formed on the front and back surfaces of core layer 13, and mounted structure in FIG. 6B is applied onto each surface to form the multi-layer wiring substrate of a dual-sided mounted structure.

(Application 7)

Figure 15:
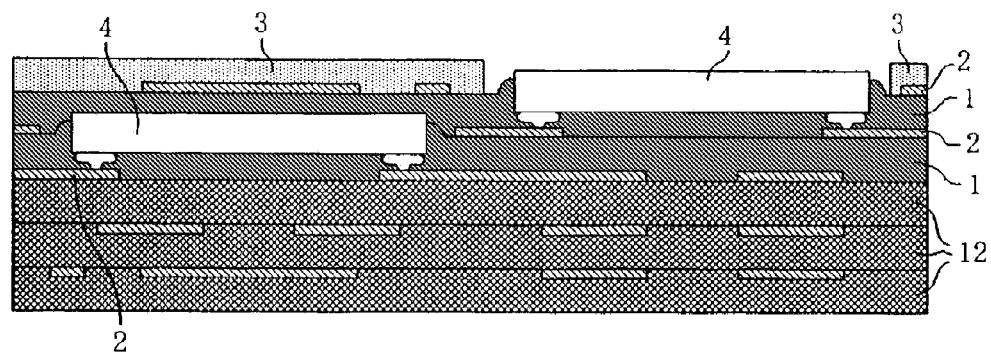
FIG. 15 A cross-sectional view of application 7 of the present invention.

FIG. 15 is a cross-sectional view showing an electronic device that is made by applying the mounted structure and its manufacturing method in FIG. 56B, uses a wiring substrate of a multi-layer structure formed by overlaying the mounted structure, and is characterized in that semiconductor chips are mounted in multi-layers. In this example, thermoplastic resin or PREPREG (PRE-imPREGnated sheet material) may be used as insulating resin layer 1 in the upper layer.

(Application 8)

Figure 16:
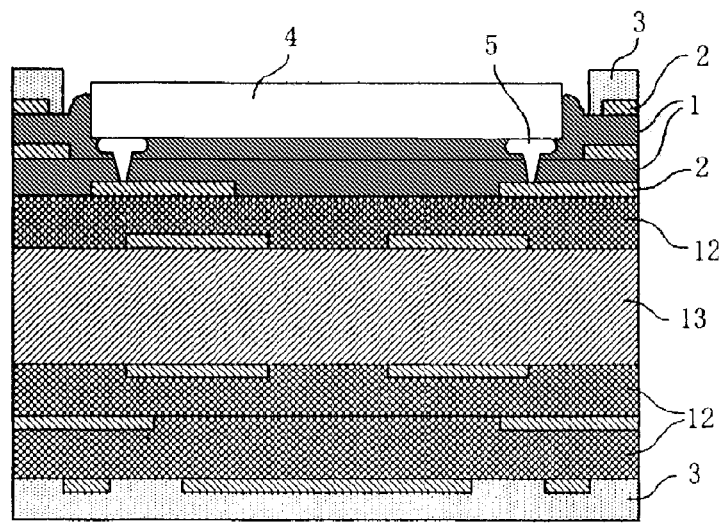
FIG. 16 A cross-sectional view of application 8 of the present invention.

FIG. 16 is a cross-sectional view showing an example in which the wiring substrate in FIG. 6B is applied to a wiring substrate of a multi-layer structure. In this example, similar to application 1 shown in FIG. 9, wiring patterns 2 and insulating layers are laminated on both surfaces of core layer 13 to form a multi-layer wiring substrate, and semiconductor chip 4 is mounted in a manner such that bumps 5 thereof pass through two thermoplastic insulating resin layers 1. In this case, wiring patterns may be formed in each insulating resin layer, and flexibility in the structures and in the wiring can be improved in comparison with the example in FIG. 9.

(Application 9)

Figure 17A:
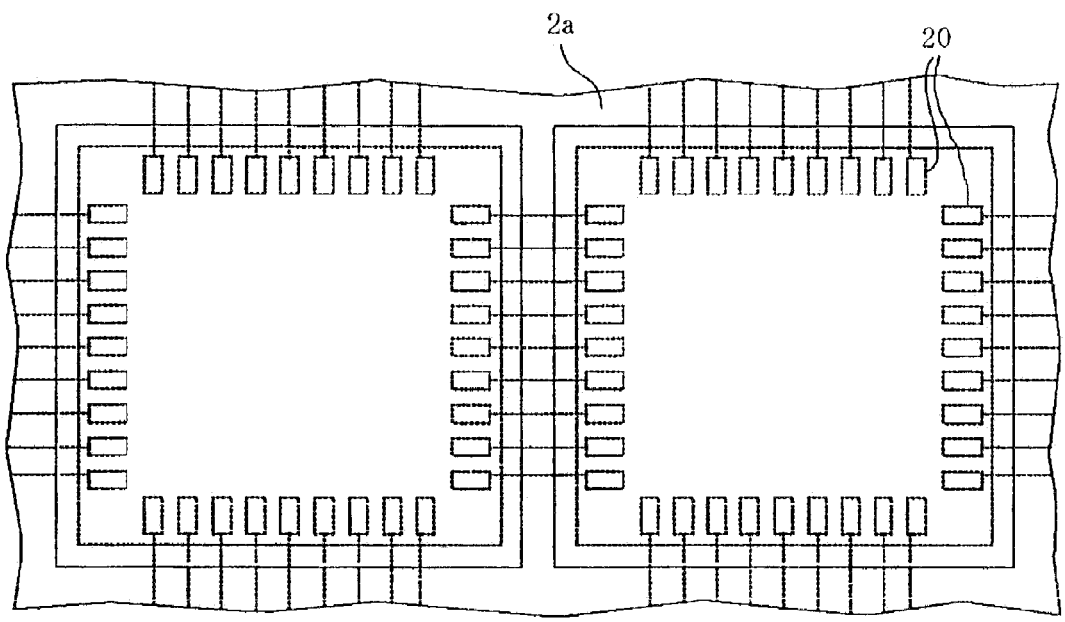
FIG. 17A A plan view of application 9 of the present invention.
Figure 17B:
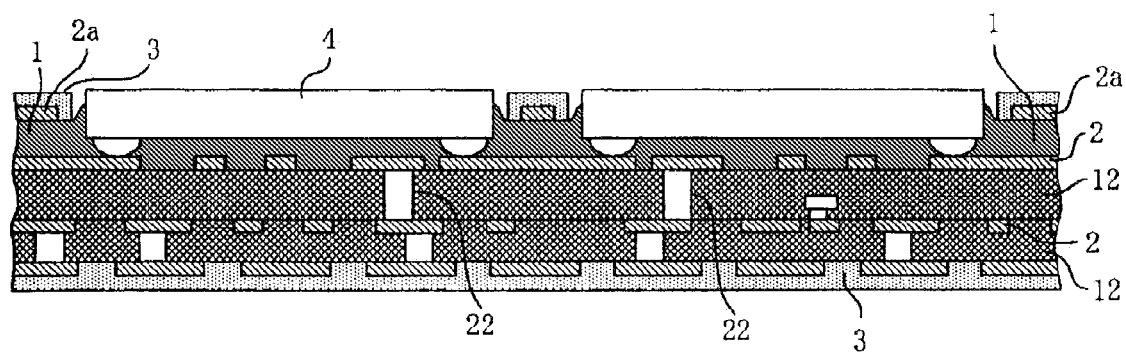
FIG. 17B A cross-sectional view of application 9 of the present invention.

FIGS. 17A and 17B are cross-sectional views showing an example that is made by applying the mounted structure and its manufacturing method in FIG. 6B, and a wiring substrate of a multi-layer structure is formed while the upper wiring layer is regarded as a ground pattern. FIG. 17A is a plan view showing the state in which the semiconductor chips are removed (mount portions for semiconductor chips are indicated by dot lines in FIG. 17A). In this example, the bumps of the semiconductor chip are directly connected to pads 20 of the internal layer wiring patterns, the wiring patterns which are connected to bumps of semiconductor chip 4 are directly connected to bumps of another semiconductor chip or have fall into the lower wiring layer through via hole 22. In this example, in the wiring substrate using the uppermost wiring layer as ground pattern 2a, the bumps of semiconductor chip 4 are connected to the wiring layer of the internal layer. Therefore, no via hole needs to be formed near the semiconductor chip, and the number of via holes can be reduced and high density mounting can be carried out. Specific explanations are given of this point. When two or more semiconductor chips are mounted on the substrate and, in particular, when filled-in ground patterns are arranged on the surface in order to block noises, one-third to one-half of all terminals are typically used as signal lines and the others are used as power source and ground terminals. Here, assuming that fifty terminals in a chip having external terminals of one hundred pins are signal lines, in the conventional structure mounted on the surface layer, in order to block noises, all the signal lines must be connected to the internal layer through via holes once and must be passed through the lower layer of the ground pattern in the surface layer to block noises, and then must be connected to the semiconductor chip, which is the connection destination, through the via holes. For fifty terminals with signal lines that are used for making a connection from the surface to the internal layer and for fifty terminals used for making a connection from the internal layer to the surface, one hundred via holes in total, i.e., twice of the number of signal lines, are required. On the other hand, in the structure where chips are directly mounted on the internal layer according to the present invention, since direct connections in the internal layer become possible, no via hole between the surface layer and the internal layer is required. Therefore, all one hundred via holes between the surface layer and the internal layer can be eliminated.

Also, according to this example, regions that are not covered by ground patterns 2a can be minimized, and the shield effects can be increased.

(Application 10)

Figure 18A:
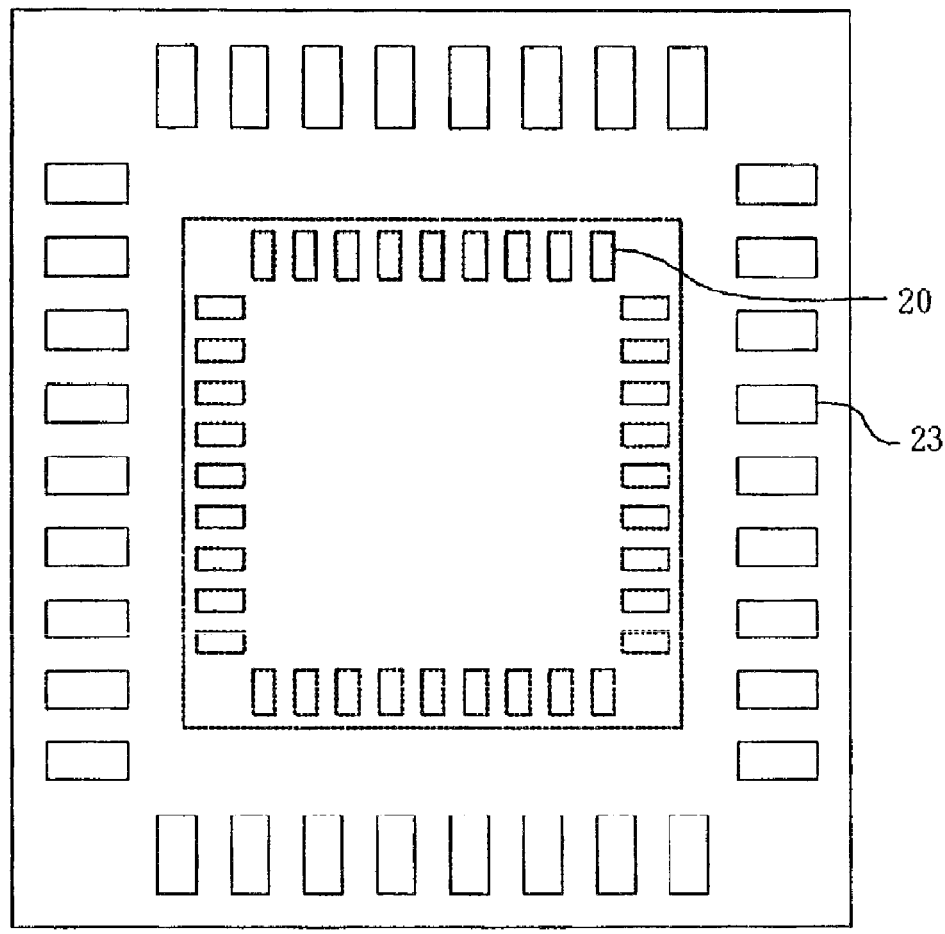
FIG. 18A A plan view of application 10 of the present invention.
Figure 18B:
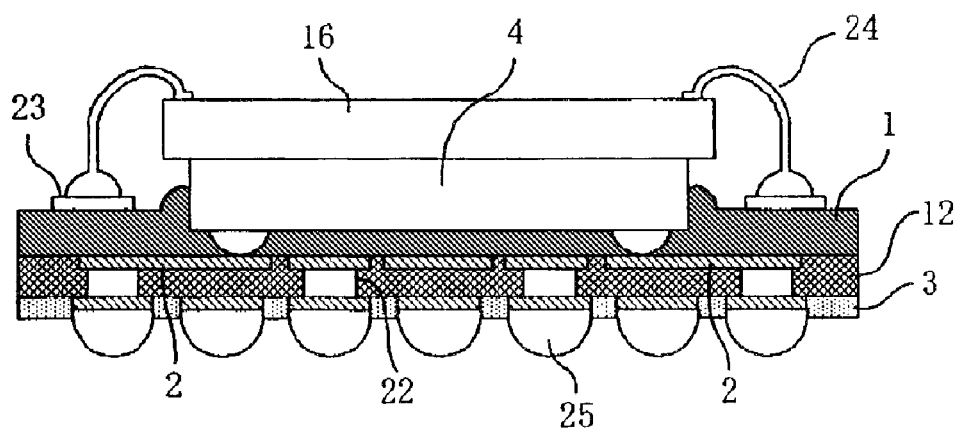
FIG. 18B A cross-sectional view of application 10 of the present invention.

FIGS. 18A and 18B are cross-sectional views showing an example that is made by applying the chip mounted structure and its manufacturing method in FIG. 6B and in which the BGA of a laminated chip structure is formed. FIG. 18A is a plan view showing the state in which the semiconductor chips are removed (mount portions for semiconductor chips are indicated by dot lines in FIG. 18A). In this example, the bumps of semiconductor chip 4 are connected to pads 20 in the internal layer wiring patterns, and another semiconductor chip 16 is mounted on semiconductor chip 4 in a face-up state. Electrodes (not shown) of another semiconductor chip 16 and pads 23 arranged at the periphery of insulating resin layer 1 are connected by bonding wires 24. Solder balls 25 are formed in the regions that are not covered by solder resist 3, on the back surface of the wiring substrate. In this example, since the bumps of semiconductor chip 4 are connected to the wiring layer of the internal layer, no via hole is required near the semiconductor chip. Therefore, the number of via holes can be reduced, and pads 23 for wire bonding can be arranged close to semiconductor chip 4. Accordingly, the length of wire bonding 24 can be made shortest. Further, according to this example, high density mounting can be carried out and the number of wiring layers can be reduced.

The invention claimed is:

1. An electronic device, comprising:
   a wiring substrate including an insulating resin layer that has a first major surface and a second major surface opposite to the first major surface and a first wiring layer that are disposed on said insulating resin layer on the second major surface side;
   a second wiring layer formed on the first major surface of said insulating resin layer; and
   a chip part including a projection electrode on a bottom surface and mounted on said wiring substrate,
   wherein said insulating resin layer holds said chip part such that a bottom and at least a part of side surfaces of said chip part are in contact with said insulating resin layer, and a top surface of said chip part is exposed on said insulating resin layer on the first major surface side, and
   wherein the projection electrode of the chip part is covered with said insulating resin layer and is connected with said first wiring layer, and wherein said chip part protrudes from the first major surface of said insulation resin layer.

2. The electronic device according to claim 1, wherein a ground pattern is formed in said second wiring layer.

3. The electronic device according to claim 1, further comprising a plurality of insulating resin layers for holding the chip part.

4. The electronic device according to claim 3, wherein the insulating resin layers for holding the chip part are laminated such that the first major surfaces are faced in the same direction.

5. The electronic device according to claim 3, wherein said insulating resin layers for holding said chip part are arranged on both surfaces of said wiring substrate.

6. The electronic device according to claim 1, wherein said wiring substrate further comprises an insulating layer except for said insulating resin layer and further comprises a wiring layer except for said first wiring layer or first and second wiring layers.

7. The electronic device according to claim 1, wherein a portion exposed from the insulating resin layer of the chip part that enters the insulating resin layer of the outmost layer in the wiring substrate, is covered by a coating resin.

8. The electronic device according to claim 1, wherein the projection electrode of said chip part is a gold electrode formed by a wire bonding technique.

9. The electronic device according to claim 1, wherein said insulating resin layer is made of thermoplastic resin or materials in which thermosetting resin is added to thermoplastic resin.

10. The electronic device according to claim 1, wherein the first major surface on which the second wiring layer is formed is arranged below the top surface of the chip part.

11. The electronic device according to claim 1, wherein the chip part is a semiconductor chip.

\* \* \* \* \*